US012571816B2

(12) United States Patent
Campbell et al.

(10) Patent No.: US 12,571,816 B2
(45) Date of Patent: Mar. 10, 2026

(54) HIGH-IMPEDANCE DIFFERENTIAL FLEXIBLE PROBE TIP

(71) Applicant: Tektronix, Inc., Beaverton, OR (US)

(72) Inventors: Julie A. Campbell, Beaverton, OR (US); David M. Ediger, Portland, OR (US); Daniel G. Knierim, Beaverton, OR (US); David Thomas Engquist, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 160 days.

(21) Appl. No.: 18/480,457

(22) Filed: Oct. 3, 2023

(65) Prior Publication Data

US 2024/0118314 A1     Apr. 11, 2024

Related U.S. Application Data

(60) Provisional application No. 63/413,586, filed on Oct. 5, 2022.

(51) Int. Cl.
| | |
|---|---|
| *G01R 1/067* | (2006.01) |
| *H01B 7/04* | (2006.01) |
| *H01B 9/00* | (2006.01) |
| *H01B 9/02* | (2006.01) |

(52) U.S. Cl.
CPC ........... *G01R 1/06755* (2013.01); *H01B 7/04* (2013.01); *H01B 9/006* (2013.01); *H01B 9/02* (2013.01)

(58) Field of Classification Search
CPC ...... G01R 1/06755; H01B 7/04; H01B 9/006; H01B 9/02; H01B 11/146
See application file for complete search history.

(56) References Cited

U.S. PATENT DOCUMENTS

| | | | |
|---|---|---|---|
| 10,302,676 B2 | 5/2019 | Mende et al. | |
| 2015/0044909 A1* | 2/2015 | Dunwoody | H05K 9/0018 439/607.56 |
| 2017/0271826 A1* | 9/2017 | Mende | H01P 1/22 |
| 2021/0318361 A1 | 10/2021 | Knierim et al. | |

* cited by examiner

*Primary Examiner* — G. M. A. Hyder
(74) *Attorney, Agent, or Firm* — Miller Nash LLP; Andrew J. Harrington

(57) ABSTRACT

A cable assembly has a connector to receive a signal, a cable connected to the connector, the cable having a length and one or more conductors along at least part of the length to conduct the signal, a magnetic material external to the one or more conductors, and an elastomer material external to the one or more conductors. A cable assembly has a connector to receive a differential signal, a cable connected to the connector having symmetric pair conductors, one or more discrete magnetic components spaced along the length of the cable, and one or more elastomer components next to at least one of the one or more magnetic components. A cable assembly has a connector to receive a differential signal, a cable connected to the connector having symmetric pair conductors, an elastomer material at least partially enclosing the cable, and a magnetic material at least partially enclosing the cable.

16 Claims, 6 Drawing Sheets

HIGH-IMPEDANCE DIFFERENTIAL FLEXIBLE PROBE TIP

CROSS-REFERENCE TO RELATED APPLICATIONS

This disclosure claims benefit of U.S. Provisional Application No. 63/413,586, titled "HIGH-IMPEDANCE DIFFERENTIAL FLEXIBLE PROBE TIP," filed on Oct. 5, 2022, the disclosure of which is incorporated herein by reference in its entirety.

TECHNICAL FIELD

This disclosure relates to test and measurement probes, and more particularly to probe tip cables.

BACKGROUND

Measuring differential high voltages with a differential probe tip is susceptible to common mode noise. U.S. Pat. No. 10,302,676, issued May 28, 2019, describes probe tip coaxial cables having improved performance by adding impedance to the cable tip with a string of rigid ferrites. This performs well electrically but with the cost of losing a lot of flexibility in the tip.

DETAILED DESCRIPTION

Embodiments of this disclosure involve probe tip cable assemblies having improved performance with added ferrites or ferrite material. The embodiments address flexibility issues in probe tip cables while retaining the impedance loading to reduce common mode noise. Embodiments of this disclosure may be implemented in many different types of probes, including isolated differential current shunt probes, such as those described in U.S. Pat. App. Pub. No. 2021/0318361, published Oct. 14, 2021, the contents of which are hereby incorporated by reference in their entirety. Generally, a probe tip cable according to embodiments of the disclosure will include a board, connector, or other interface for coupling to a device under test at one end, and a board, connector, or other interface for coupling to a test probe or test instrument at the other end.

As used here, the discussion uses terms "ferrite," "ferromagnetic," and "magnetic" refer to material or discrete components that can provide the impedance loading to reduce common mode noise. The term "magnetic" as used here encompasses all those terms. The magnetic material is selected based upon a strength of the magnetic material and at least one of a frequency of the differential signal and magnetic fields around the conductors in a particular environment.

Figure 1:
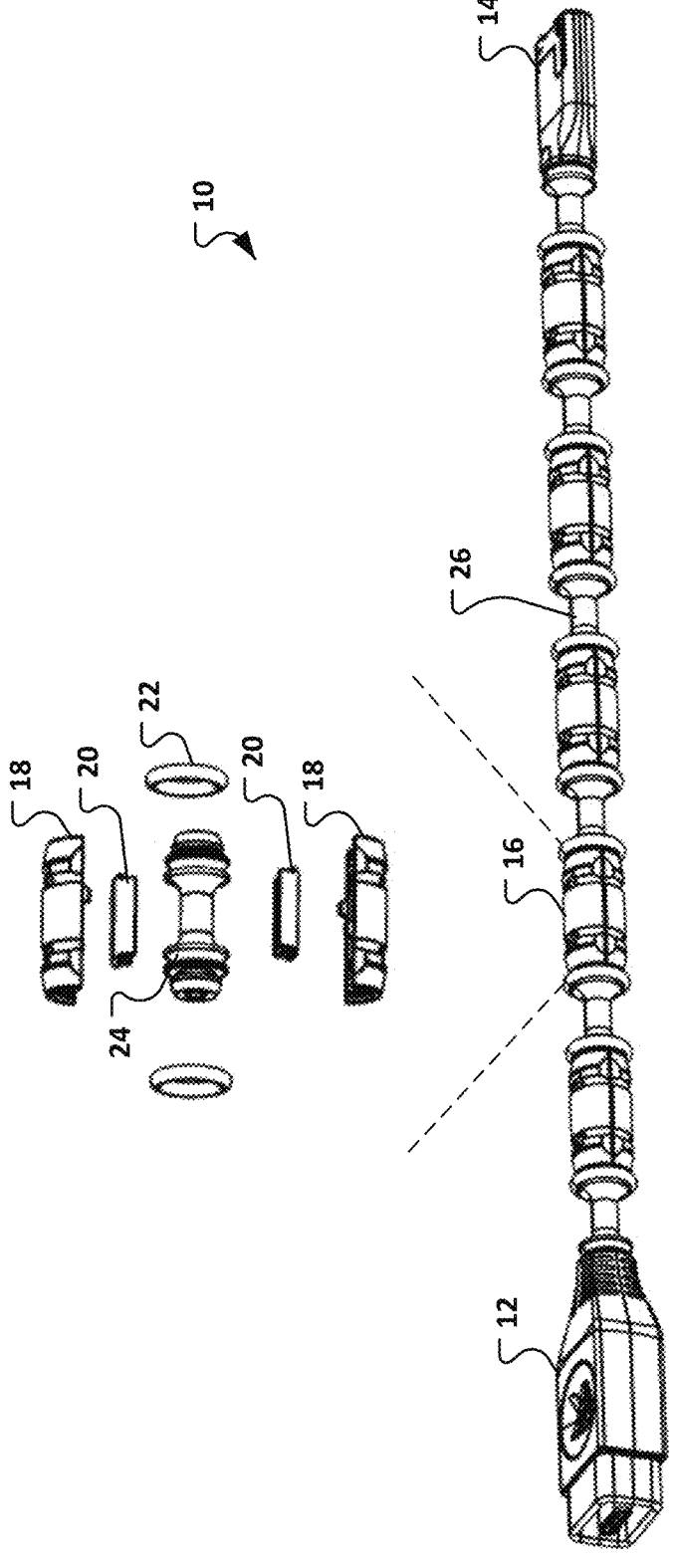
FIG. 1 shows an embodiment of a cable tip assembly having discrete magnetic elements.
Figure 2:
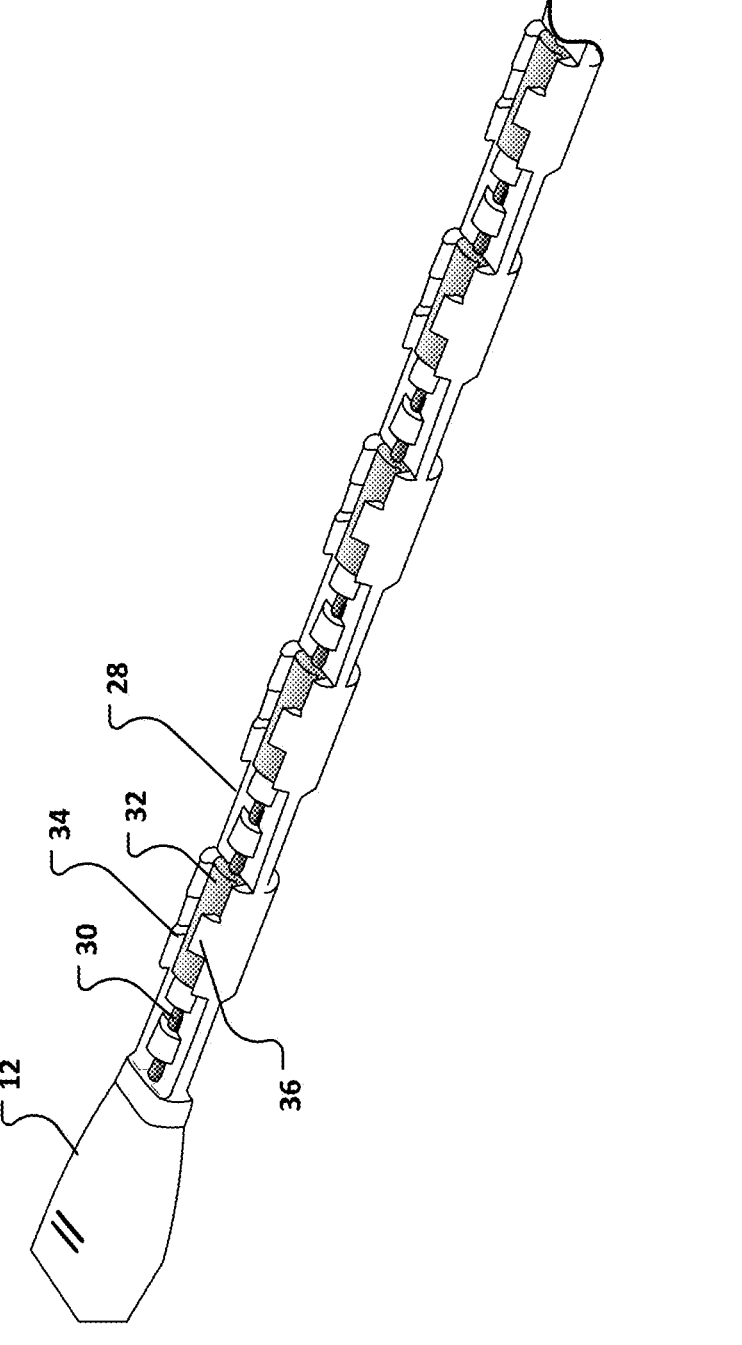
FIG. 2 shows an embodiment of a cable tip assembly using an elastomer sleeve.
Figure 3:
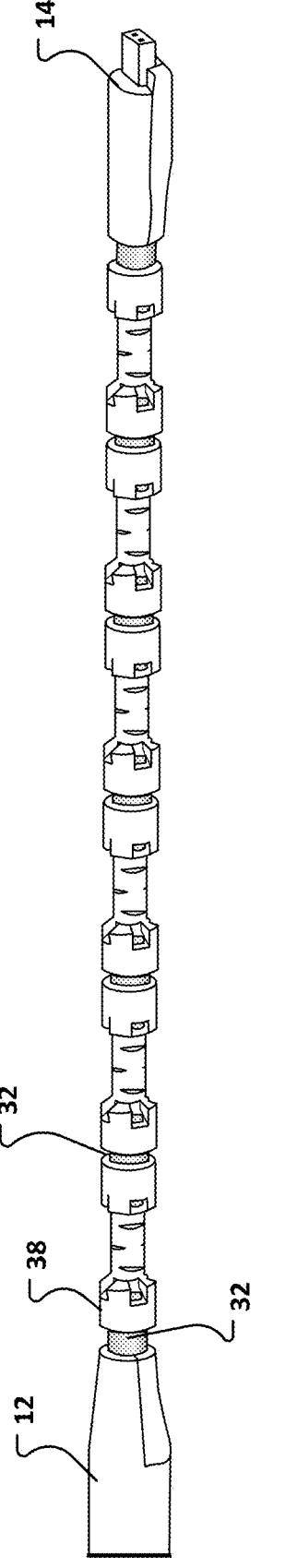
FIG. 3 shows an embodiment of a cable tip assembly having a cable threaded through elastomer and magnetic elements.

FIGS. 1-3 show embodiments in which the magnetic material takes the form of discrete magnetic components, meaning that they are individual components. When the magnetic components comprise discrete magnetic components, the assemblies that contain them are designed to allow a user to select a number of magnetic components to be included. The user can remove the magnetic components from the cable or add them back in if they were previously removed. The user may select the number of magnetic components needed based upon a particular application in which the user employs the cable. How the user changes the number of magnetic components varies between embodiments. In some embodiments, the user may also select the positions of the magnetic components.

FIG. 1 shows an embodiment of a cable tip assembly 10. One should note that all the various embodiments apply to this type of cable tip assembly, although the entire cable with connectors and tips may not appear in other drawings. Cable tip assembly 10 comprises a connector 12 that connects the cable tip assembly to a test and measurement instrument. A connector 14 at the other end of the cable tip assembly connects to the probe tip. A cable runs between 12 and 14. The cable has a length that has magnetic components residing on the cable. In FIG. 1 the magnetic elements and elastomer elements cover the cable. The magnetic elements are attached to the cable, but are external to the conductors, and may reside on a jacket sleeve that encases the cable for protection.

The cable has one or more conductors to conduct signals between connectors 12 and 14, shown in further drawings. The conductors may comprise symmetric pair conductors that traverse the cable in a symmetric pair, as opposed to coaxial, manner. These types of conductors include twin axial, twin lead, twisted pairs, two matched traces on a flex circuit, etc.

In the embodiment of FIG. 1, an assembly 16 makes up a magnetic component. As can be seen in the exploded view above, the magnetic component comprises a housing having two halves 18 that mate around the cable and contain two half-pieces, or halves, 20 of a magnetic material. The housing halves mate around a center piece 24 that holds the cable. When the housing halves that hold the magnetic components such as ferrites mate around the cable, a retainer 22, in this embodiment one or more O-rings, then acts to clamp the housing halves around the ferrites and hold them in a fixed location on the cable, and to minimize any air gaps between the halves. The O-ring slides up around the halves either in the middle of the halves, or at the end.

The O-rings also act to retain elastomer elements such as elastomer strain relief linkages 26 at either end of the assembly such as 16. If one assembly is used, the ends of that assembly may clamp to the cable and 'catch' or otherwise retain the elastomer element next to the assembly. This allows the cable to bend without the rigid assemblies hitting each other. If a user wants to use fewer assemblies, the user can roll the O-rings away from the housing halves, separate them, and remove them from the cable.

FIG. 2 show an embodiment of discrete magnetic components 32 mounted into an elastomer sleeve 28. The elastomer sleeve has tabs such as 34 and 36. The cable 30 runs the length of the sleeve between the connectors such as 12. The magnetic components are loaded into the sleeve from the top and retained by the tabs. Once the sleeve contains the desired number of magnetic components, the cable 30 is then pushed through the center. This captures the magnetic components and fixes them into their locations. The user can select a number of magnetic components to load prior to putting the cable through the center. If the user wants to change the number of magnetic components by removing some, the user can unthread the cable, remove some of the magnetic components and then rethread the cable.

FIG. 3 shows another embodiment of a cable employing discrete magnetic components. The cable, prior to attaching at least one of the connectors 12, 14, is threaded with some number of magnetic components such as 32. An elastomer component 38 is threaded between at least two of the magnetic components. The elastomer component may take the form of a dumbbell, with the larger parts on either end providing the retainer to hold the magnetic components in fixed locations and keeping the cable from being pinched by the edges of the magnetic components. If the user wants to change the number of magnetic components, the user can thread fewer magnetic components on the cable. The number of elastomer components may be increased to fill the gap to prevent the other magnetic components from sliding along the length of the cable.

In addition to the discrete magnetic elements, the magnetic material may at least partially enclose the cable. The term "enclose" as used here means that the magnetic material surrounds the outer surface of the cable along most of its length. The magnetic material may only partially enclose the cable in that the ends may not be completely enclosed by the magnetic material at the connectors.

Figure 4:
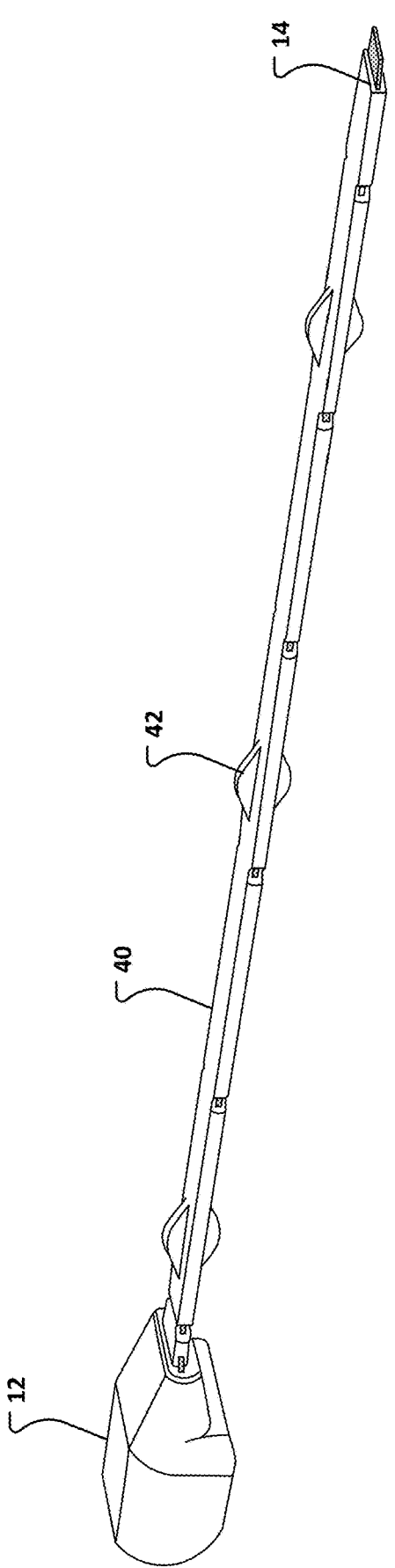
FIG. 4 shows an embodiment of a cable tip assembly having an overmold.

FIG. 4 shows an embodiment in which the magnetic material and the elastomer material are combined in an elastomer overmold 40 over the cable, and in some embodiments the body of the connectors 12 and 14. The elastomer material has magnetic material impregnated into it, such as by impregnating ferromagnetic material powders into the elastomer when it is still in liquid form. The combined material is then injection molded such that when the material cures, the magnetic material is part of the elastomer material. In embodiments where the cable comprises a flex circuit, the overmold may have different thicknesses such as area 42 along the length to protect regions of the flex circuit, such as vias in specific areas.

Figure 5:
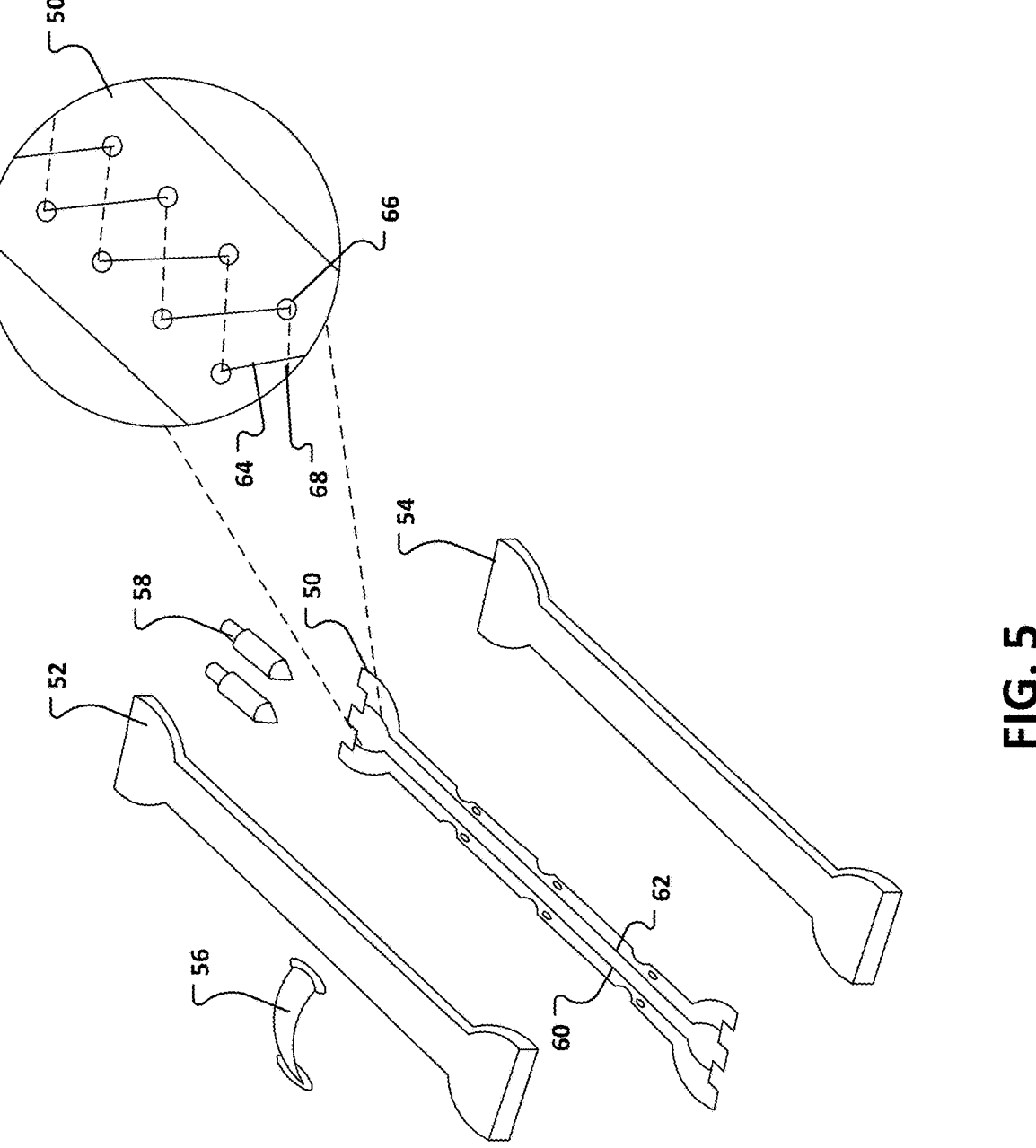
FIG. 5 shows an embodiment of a cable tip assembly using magnetic material with an adhesive.

In another embodiment, the magnetic material and the elastomer material may make up an adhesive tape, as shown in FIG. 5. The elastic magnetic tape may comprise a tape that combines the magnetic material, the adhesive, and the elastomer, such as strips of tape with removal strips that would expose the adhesive. Examples include pyrolytic graphite sheets (PGS) and "µ-metal" tape, or magnetic shielding tape or film. PGS has been found to have weak magnetic effects, even though graphite is generally not considered a magnetic material but is considered a magnetic material in the embodiments herein.

In FIG. 5, the cable may take the form of a flex circuit mentioned above. Flex circuit 50 has twin axial conductors 60 and 62 to conduct a differential signal. As shown in the exploded view, the conductors may be interwoven. The flex circuit 50 has vias such as 66. One conductor, 68 and the other conductor 64 alternate between being on an "upper" layer of the flex circuit, represented by solid lines, or on a "lower" layer of the flex circuit after passing through the vias, represented by the dashed lines. In either embodiment, the elastic magnetic tape pieces 52 and 54 mate around the flex circuit 50 and the connection pins such as 58. A clip 56 then allows the cable to mate to the connector(s). Connection pins 58 and clip 56 may be part of connector 12 or connector 14 in some embodiments.

Figure 6:
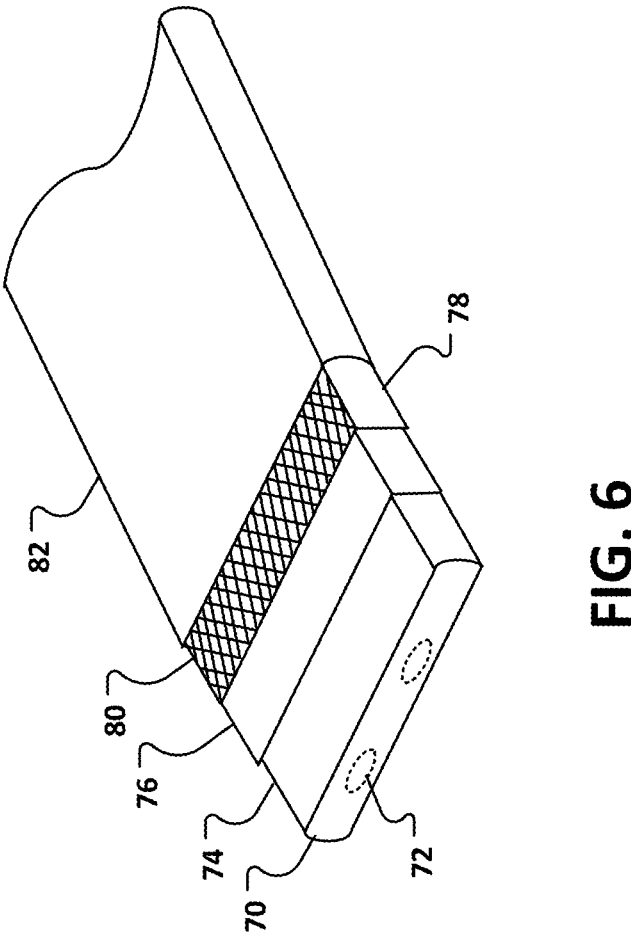
FIG. 6 shows an embodiment of a cable usable with a cable tip assembly.

In addition to the use of magnetic components to control the common mode noise by including magnetic components on the cable, the cable itself may include other elements to assist. As shown in FIG. 6, a cable structure has a braided shielding layer inside the protective jacket 82 common to most cables. The connector end 70 has conductors such as 72, which may be encased in a dielectric 74. The cable then may have a first shielding layer 76, such as a copper alloy. The cable may include an addition metalized barrier 78. In one embodiment here, the additional metalized barrier may comprise a braid 80. One should note that the various layers and the jacket extend to the connector end 70 but are cut away to show the various layers.

In this manner, one can provide a flexible cable that retains the impedance loading to eliminate or mitigate common mode noise.

Aspects of the disclosure may operate on a particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the disclosed technologies are provided below. An embodiment of the technologies may include one or more, and any combination of, the examples described below.

A cable assembly, comprising: a connector structured to receive a signal; a cable connected to the connector, the cable having a length and one or more conductors along at least part of the length to conduct the signal; a magnetic material external to the one or more conductors; and an elastomer material external to the two or more conductors.

Example 2 is the cable assembly of Example 1, wherein the magnetic material comprises one or more discrete magnetic elements.

Example 3 is the cable assembly of Example 2, wherein a number of the one or more discrete magnetic elements external to the one or more conductors is user selectable.

Example 4 is the cable assembly of Example 2, wherein the number of one or more discrete magnetic elements are attached to the cable at fixed locations.

Example 5 is the cable assembly of Example 2, wherein the elastomer material comprises one or more elastomer elements, the elastomer elements being next to at least one of the one or more discrete magnetic elements along a length of the cable.

Example 6 is the cable assembly of any of Examples 1 through 5, wherein the magnetic material is selected based upon a strength of the magnetic material and at least one of a frequency of the differential signal and magnetic fields around the conductors in a particular environment.

Example 7 is the cable assembly of any of Examples 1 through 6, wherein the elastomer comprises an elastomer material encompassing a majority of the length of the cable.

Example 8 is the cable assembly of Example 7, wherein the magnetic material comprises a magnetic material encompassing a majority of the length of the cable.

Example 9 is the cable assembly of any of Examples 1 through 8, wherein the cable comprises a flexible circuit substrate.

Example 10 is the cable assembly of any of Examples 1 through 9, wherein the one or more conductors comprise symmetric pair conductors comprised one of twin axial conductors, twin lead conductors, twisted pairs, or matched traces.

Example 11 is the cable assembly of any of Examples 1 through 10, wherein the one or more conductors comprise twin axial conductors that are interwoven.

Example 12 is the cable assembly of any of Examples 1 through 11, wherein the cable assembly further comprises a braid of conductive wires between the one or more conductors and the magnetic material.

Example 13 is a cable assembly, comprising: a connector structured to receive a differential signal; a cable connected to the connector, the cable having symmetric pair conductors to conduct the differential signal; one or more discrete magnetic components spaced along the length of the cable; and one or more elastomer components, at least one of the one or more elastomer components next to at least one of the one or more magnetic components along the length of the cable.

Example 14 is the cable assembly of Example 13, wherein a number of discrete magnetic elements used along the length of the cable depends upon at least one of the frequency of the differential signal and magnetic fields around the conductors in a particular environment.

Example 15 is the cable assembly of either of Examples 13 or 14, wherein each discrete magnetic component comprises: two halves of a magnetic material; a housing having two halves, each half configured to contain one of the two halves of the magnetic material; and one or more retainers to hold the housing halves containing the halves of the magnetic material around the cable and at least a portion of at least one of the one or more elastomer components, the retainer to clamp the housing together around the cable and hold the at least one of the one or more elastomer components.

Example 16 is the cable assembly of any of Examples 13 through 15, wherein the one or more elastomer components comprise locations along an elastomer sleeve, each location having an opening configured to accept one of the one or more magnetic components and at least one flexible tab to retain the magnetic component, the elastomer sleeve having a hole along its length into which the cable is inserted.

Example 17 is the cable assembly of any of Examples 13 through 16, wherein: the one or more elastomer components comprise one or more discrete elastomer elements, each elastomer element having a hole through the elastomer element to allow the elastomer element to be threaded onto the cable; and the one or more discrete magnetic elements each having a hole through the magnetic element to allow the magnetic element to be threaded onto the cable, each elastomer element having a retainer at least at one end of the elastomer element configured to retain an end of one of the one or more magnetic elements.

Example 18 is a cable assembly, comprising: a connector structure to receive a differential signal; a cable connected to the connector, the cable having symmetric pair conductors to conduct the differential signal; an elastomer material at least partially enclosing the cable; and a magnetic material at least partially enclosing the cable.

Example 19 is the cable assembly of Example 18, wherein the elastomer material and the magnetic material comprise an overmolded elastomer impregnated with magnetic material.

Example 20 is the cable assembly of Example 19, wherein the cable comprises a flex circuit and the overmolded elastomer has regions thicker than other regions to protect specific regions on the flex circuit.

Example 21 is the cable assembly of any of Examples 18 through 20, wherein the elastomer material and the magnetic material comprise an elastic magnetic tape adhered to either side of the cable.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Although specific examples of the invention have been illustrated and described for purposes of illustration, it will be understood that various modifications may be made without departing from the spirit and scope of the invention. Accordingly, the invention should not be limited except as by the appended claims.

The invention claimed is:

1. A cable assembly, comprising:
a connector structured to receive a signal;
a cable connected to the connector, the cable having a length and one or more conductors along at least part of the length to conduct the signal;
a magnetic material external to the one or more conductors; and
an elastomer material external to the one or more conductors,
wherein the magnetic material comprises one or more discrete magnetic elements,
wherein a number of the one or more discrete magnetic elements external to the one or more conductors is user selectable.

2. The cable assembly as claimed in claim 1, wherein the number of one or more discrete magnetic elements are attached to the cable at fixed locations.

3. The cable assembly as claimed in claim 1, wherein the elastomer material comprises one or more elastomer elements, the elastomer elements being next to at least one of the one or more discrete magnetic elements along a length of the cable.

4. A cable assembly, comprising:
a connector structured to receive a signal;
a cable connected to the connector, the cable having a length and one or more conductors along at least part of the length to conduct the signal;
a magnetic material external to the one or more conductors; and
an elastomer material external to the one or more conductors,
wherein the magnetic material is selected based upon a strength of the magnetic material and at least one of a frequency of the differential signal and magnetic fields around the conductors in a particular environment.

5. The cable assembly as claimed in claim 1, wherein the elastomer comprises an elastomer material encompassing a majority of the length of the cable.

6. The cable assembly as claimed in claim 5, wherein the magnetic material comprises a magnetic material encompassing a majority of the length of the cable.

7. A cable assembly, comprising:
a connector structured to receive a signal;
a cable connected to the connector, the cable having a length and one or more conductors along at least part of the length to conduct the signal;
a magnetic material external to the one or more conductors; and an elastomer material external to the one or more conductors,
wherein the cable comprises a flexible circuit substrate.

8. The cable assembly as claimed in claim 1, wherein the one or more conductors comprise symmetric pair conductors comprised of one of twin axial conductors, twin lead conductors, twisted pairs, or matched traces.

9. The cable assembly as claimed in claim 1, wherein the one or more conductors comprise twin axial conductors that are interwoven.

10. The cable assembly as claimed in claim 1, wherein the cable assembly further comprises a braid of conductive wires between the one or more conductors and the magnetic material.

11. A cable assembly, comprising:
a connector structured to receive a differential signal;
a cable connected to the connector, the cable having symmetric pair conductors to conduct the differential signal;
one or more discrete magnetic components spaced along the length of the cable; and
one or more elastomer components, at least one of the one or more elastomer components next to at least one of the one or more magnetic components along the length of the cable;
wherein a number of the one or more discrete magnetic components is user selectable.

12. The cable assembly as claimed in claim 11, wherein a number of discrete magnetic components used along the length of the cable depends upon at least one of the frequency of the differential signal and magnetic fields around the conductors in a particular environment.

13. The cable assembly as claimed in claim 11, wherein each discrete magnetic component comprises:
two halves of a magnetic material;
a housing having two halves, each half configured to contain one of the two halves of the magnetic material; and
one or more retainers to hold the housing halves containing the halves of the magnetic material around the cable and at least a portion of at least one of the one or more elastomer components, the retainer to clamp the housing together around the cable and hold the at least one of the one or more elastomer components.

14. The cable assembly as claimed in claim 11, wherein the one or more elastomer components comprise locations along an elastomer sleeve, each location having an opening configured to accept one of the one or more magnetic components and at least one flexible tab to retain the magnetic component, the elastomer sleeve having a hole along its length into which the cable is inserted.

15. The cable assembly as claimed in claim 11, wherein:
the one or more elastomer components comprise one or more discrete elastomer elements, each elastomer element having a hole through the elastomer element to allow the elastomer element to be threaded onto the cable; and
the one or more discrete magnetic components each having a hole through the magnetic component to allow the magnetic component to be threaded onto the cable, each elastomer element having a retainer at least at one end of the elastomer element configured to retain an end of one of the one or more magnetic components.

16. A cable assembly, comprising:
a connector structured to receive a differential signal;

a cable connected to the connector, the cable having symmetric pair conductors to conduct the differential signal;

an elastomer material at least partially enclosing the cable; and a magnetic material at least partially enclosing the cable;

wherein the cable comprises a flex circuit;

wherein the elastomer material and the magnetic material comprise at least one of an elastic magnetic tape adhered to either side of the cable, and an overmolded elastomer impregnated with magnetic material, the overmolded elastomer having regions thicker than other regions to protect specific regions on the flex circuit.

\* \* \* \* \*